United States Patent
Shinohara et al.

[11] Patent Number: 6,100,465
[45] Date of Patent: Aug. 8, 2000

[54] SOLAR BATTERY HAVING A PLURALITY OF I-TYPE LAYERS WITH DIFFERENT HYDROGEN DENSITIES

[75] Inventors: Hisato Shinohara, Yamanashi; Yasuyuki Arai, Kanagawa, both of Japan

[73] Assignees: Semiconductor Energy Laboratory Co., Ltd., Kanagawa-ken; TDK Corporation, Tokyo, both of Japan

[21] Appl. No.: 09/021,641

[22] Filed: Feb. 10, 1998

Related U.S. Application Data

[62] Division of application No. 08/608,543, Feb. 28, 1996, Pat. No. 5,736,431.

[30] Foreign Application Priority Data

Feb. 28, 1995 [JP] Japan ................................ 7-066928

[51] Int. Cl.⁷ ................................................ H01L 31/075
[52] U.S. Cl. ............................................ 136/258; 136/261
[58] Field of Search ............................ 136/258 AM, 261

[56] References Cited

U.S. PATENT DOCUMENTS

| | | | |
|---|---|---|---|
| 5,571,749 | 11/1996 | Matsuda et al. | 438/484 |
| 5,635,408 | 6/1997 | Sano et al. | 438/58 |
| 5,676,765 | 10/1997 | Saito et al. | 136/258 |

FOREIGN PATENT DOCUMENTS

| | | | |
|---|---|---|---|
| 59-213176 | 12/1984 | Japan | 136/258 AM |
| 62-7172 | 1/1987 | Japan | 136/258 AM |
| 6-151917 | 5/1994 | Japan | 136/258 AM |

*Primary Examiner*—Nam Nguyen
*Attorney, Agent, or Firm*—Fish & Richardson P.C.

[57] ABSTRACT

In producing a thin film solar battery using a semiconductor film producing apparatus, a semiconductor film is formed on a substrate by glow discharge decomposition. The substrate is transported in a desired direction within a glow discharge space. A substrate heating unit heats the substrate at different temperatures along the desired direction in which the substrate is transported. Consequently, a plurality of semiconductor layers having different hydrogen concentrations are laminated at desired thicknesses with desired characteristics. A glow discharge generating unit generates high frequency power having different frequencies and/or different power outputs along the desired direction in which the substrate is transported.

25 Claims, 7 Drawing Sheets

SOLAR BATTERY HAVING A PLURALITY OF I-TYPE LAYERS WITH DIFFERENT HYDROGEN DENSITIES

This is a divisional of U.S. application Ser. No. 08/608,543, filed Feb. 28, 1996, now U.S. Pat. No. 5,736,431.

BACKGROUND

1. Technical Field

The present invention relates to a thin film solar battery having a substrate made of glass. flexible plastic stainless steel or the like, on which electrodes and a photoelectric conversion layer are laminated, and a method and apparatus for producing the thin film solar battery.

2. Background Information

A thin film solar battery is produced using a glass substrate, or a flexible plastic or stainless steel film having a thickness of about 100 μm as a substrate. The thin film solar battery is so constituted that a photoreflective electrode, a photoelectric conversion layer and a transparent electrode are laminated on a primary surface of the substrate. The thin film solar battery is also constituted, for example, such that the transparent electrode is formed on the primary surface of the substrate, and the photoelectric conversion layer and the photoreflective electrode are formed on the transparent electrode, or such that another transparent electrode is used instead of the photoreflective electrode so that the photoelectric conversion electrode is interposed between these two transparent electrodes.

FIG. 1 is one example of a cross-sectional structural view of a conventional thin film solar battery. A photoreflective electrode 102 formed on a substrate 101 is made of a metal having a high reflectance such as Al (aluminum) or Ag (silver). The thickness of the photoreflective electrode 102 is usually about 0.1 to 1 μm.

These metals relatively readily react mutually with Si (silicon) which is a component of a photoelectric conversion layer 103 formed on the photoreflective electrode 102 so that the former is alloyed with the latter.

To prevent such a reaction, a metal such as Cr (chromium), Ni (nickel), Ti (titanium) or stainless steel, or a metal oxide such as ZnO (zinc oxide) is formed thinly as a diffusion blocking layer (barrier layer) on the metal having a high photo reflectance, to form a photoreflective electrode (not shown). The thickness of this diffusion blocking layer is normally about 0.1 μm or less.

The photoelectric conversion layer 103 is formed by a PIN junction of non-single crystalline semiconductors that mainly contain silicon. The photoelectric conversion layer 103 has a single cell structure using one PIN junction, a two-layer tandem cell structure having two PIN junctions connected in series, a three-layer tandem cell structure having three PIN junctions connected in series, etc. These structures are appropriately selected in accordance with the application or purpose.

As a method of producing the PIN junction of the nonsingle crystalline semiconductors that mainly contain silicon, a glow discharge decomposition method (plasma-enhanced CVD) is used. The glow discharge decomposition is a method wherein a reaction gas resulting from mixing silane gas, used as a source of silicon, with a dilution gas such as hydrogen, as occasion demands, and a doping gas such as diborane or phosphine, for the purpose of controlling valence electrons, is introduced into a reaction chamber which is under vacuum. Glow discharge is developed in the reaction chamber. The reaction gas is decomposed by the discharge energy, and the decomposed reaction gas is deposited on the substrate to form a film.

In this method, the non-single crystalline semiconductor is produced by applying a high frequency electric power (normally 13.50 MHz) of 0.01 to 10 mW per unit area ($cm^2$) under conditions where the substrate temperature is 100 to 250° C., preferably 150 to 240° C., and the reaction pressure is 0.01 to 10 Torr, preferably 0.03 to 1 Torr.

It is known that non-single crystalline semiconductor films produced by the above glow discharge decomposition contain hydrogen in an amount of several to several tens of atom per cent therein, depending on the manufacturing conditions. The content of hydrogen can be intentionally changed depending upon the substrate temperature when forming a film, the mixture ratio of reaction gases (silane, hydrogen), and discharge power.

For an N-type non-single crystalline semiconductor, there is used a silicon thin film to which phosphorus (atomic symbol: P) is added, for example, a (amorphous)—Si:H, pc (microcrystal)—Si:H, and a-SiC:H to which carbon is added. For a substantially-intrinsic I-type non-single crystalline semiconductor, there is used a-Si:H, a-SiGe:H to which germanium is added, and a-SiC:H. For a P-type non-single crystalline semiconductor, there is used a-Si:H, μc-Si:H, and a-SiC:H wherein boron (atomic symbol: B) is added to each.

In the photoelectric conversion layer, the N-type layer is 5 to 50 nm in thickness, preferably 20 to 30 nm, the I-type layer is 30 to 1000 nm, preferably 30 to 60 nm in thickness, and the P-type layer is 5 to 250 nm, preferably 10 to 50 nm in thickness. In the photoelectric conversion layer, the N-type layer, the I-type layer, and the P-type layer are generally laminated on the photoreflective electrode in the stated order. Layers in order of P, I and N may also be laminated.

The transparent electrode 104 is made of an alloy of indium oxide and tin, tin oxide or the like, and is formed by sputtering. The thickness of the transparent electrode layer is 40 to 200 nm.

An apparatus for producing the photoelectric conversion layer includes a reaction chamber, a gas exhaust unit for exhausting gas in the reaction chamber to evacuate the interior of the reaction chamber, a gas introduction unit for introducing a reaction gas into the reaction chamber, a substrate holding unit for holding a substrate on which a film is formed in the interior of the reaction chamber, and a glow discharge generating unit.

The glow discharge generation unit includes two parallel electrodes consisting of a cathode and an anode, and is generally called the capacitive coupling type. There are many cases in which the anode is held at ground potential and serves as the substrate holding unit and substrate heating unit. The cathode is connected to a high-frequency power source, and a high-frequency power is applied between the cathode and the anode to generate a glow discharge.

The photoelectric conversion layer of the thin film solar battery is formed by the PIN junction, and the reaction gas for forming each of those layers is different from each other. For that reason, the apparatus for producing the photoelectric conversion layer is equipped with an exclusive reaction chamber for each of the P-, I-, and N-layers.

In producing the thin film solar battery using a flexible substrate, there is used an apparatus in which the flexible substrate wound in the form of a roll is unwound from one roll, a film is formed on the flexible substrate while the flexible substrate is allowed to pass through the reaction chamber, and the flexible substrate is wound up on the other roll. This is called the roll-to-roll type.

FIG. 2 is one example of a semiconductor film producing apparatus of the conventional roll-to-roll type. This apparatus includes an unwind chamber 201 for unwinding a flexible substrate 200 wound on a bobbin 225; a wind-up chamber 205 having a wind-up bobbin 226; respective reaction chambers 202, 203, and 204 for P, I, and N layers; slits 221, 22,223, and 224 for partitioning the respective reaction chambers; substrate heating units 206, 207, and 208; glow discharge generating electrodes 209, 210, and 211 connected to high frequency power supplies 212, 213, and 214; gas exhaust units 215, 216, and 217; and gas introduction units 218, 219, and 220.

The thin film solar battery using the non-single crystalline semiconductor that mainly contains silicon suffers from a problem of light deterioration such that the photoelectric conversion characteristic is deteriorated by light irradiation. It has been confirmed that the light deterioration is caused by deterioration of the I-type layer of the photoelectric conversion layer, which is made of an alloy of substantially-intrinsic amorphous silicon hydride.

It is known that the light deterioration of the thin film solar battery is changed in accordance with external conditions such as light intensity or temperature at the time of light irradiation, or conditions under which the photoelectric conversion layer is manufactured.

It is also known that the deterioration of the I-type layer made of an alloy of amorphous silicon hydride is caused by an increase of the defect density in the I-type layer. The defect density can be measured by a method such as the electron spin resonance method or the like. The increase in the detect density due to light deterioration has also been observed through the electron spin resonance method.

Specifically, it is known that the initial state defect density of about $1 \times 10^{15}$ per $cm^3$ is increased to about $5 \times 10^{16}$ or more due to light deterioration.

The reasons why the defect density increases have been variously discussed and have not yet been sufficiently proven. One of the reasons which has been indicated is that the increase in the defect density is influenced by (bonding) hydrogen contained in the film made of an alloy of amorphous silicon hydride. See e.g., Kazuo Morigaki,"Light inductive phenomenon in amorphous silicon hydrogen", Solid-State Physics, Vol. 29, No. 5, 1988, at p.1. This result alleges that the light deterioration is reduced as hydrogen contained in the film is decreased.

Although the density of (bonding) hydrogen in the amorphous silicon hydride alloy is changed in accordance with the conditions under which the film is formed, it is effective and necessary to increase the substrate temperature for the purpose of decreasing the hydrogen density.

In view of this, by comparing the light deterioration ratio of a solar battery having a larger hydrogen density in the I-type layer to the light deterioration of a solar battery having a relatively smaller hydrogen density, by changing the substrate temperature at the time of forming the I-type layer, it has been confirmed that the solar battery having the smaller hydrogen density is reduced in the light deterioration ratio more than the battery having the larger hydrogen density.

The solar battery having the larger hydrogen density has been manufactured at 120° C. as the temperature at which the I-type layer is formed. The solar battery having the smaller hydrogen density has been manufactured at 240° C. as the temperature at which the I-type layer is formed.

FIG. 3 shows the comparison result of the characteristics of the solar batteries each having a different hydrogen density of the I-type layer. Sample A has a hydrogen density of 28 atom percent, and sample B has a hydrogen density of 12 atom percent. The ratio of deterioration of these samples A and B after a light of AM1.5 and 100 mW/cm² has been continuously irradiated for 1000 hours at a sample temperature of 50° C. in an open circuit state has been compared. As a result, it has been observed that the ratio of deterioration in the sample A is about 40%, and the ratio of deterioration in the sample B is about 25%.

In comparing the initial photoelectric conversion characteristics of these solar batteries with each other, the initial efficiency (EFF) of conversion of the solar battery of sample A, having a high hydrogen density, is 9.5% whereas the efficiency of conversion of the solar battery of sample B is 7.5%. The difference in the initial conversion efficiency between the samples A and B is caused by the temperature at which the I-type layer is formed. The characteristics of these solar batteries are shown in Table 1. The difference in the conversion efficiency between these two samples appears in the fill factor (FF) and open-circuit voltage (VOC).

TABLE 1

|          | $E_{ff}$ (%) | FF   | Jsc (mA) | Voc (V) |
|----------|--------------|------|----------|---------|
| Sample A | 9.5          | 0.73 | 14.5     | 0.90    |
| Sample B | 7.5          | 0.61 | 14.8     | 0.86    |

In Table 2, the optical gap ($E_g$) of the I-type layer in sample A, which is high in the density of hydrogen, is 1.80 eV whereas the optical gap of the I-type layer in sample B, which is low in the density of hydrogen, is 1.72 eV. Other characteristics such as dark conductivity (6d), light conductivity (6p) and defect density ($N_d$) do not have so large a difference between the samples A and B. Thus, the difference in open-circuit voltage between the samples A and B is caused mainly by the difference in the optical gap of the I-type layer between the samples A and B.

TABLE 2

|          | $E_g$ (eV) | $\sigma_d$ (S/cm) | $\sigma_p$ (S/cm) | $N_d$ ($cm^{-3}$) |
|----------|------------|-------------------|-------------------|-------------------|
| Sample A | 1.80       | $5 \times 10^{-11}$ | $1.5 \times 10^{-5}$ | $2 \times 10^{15}$ |
| Sample B | 1.72       | $1 \times 10^{-10}$ | $6 \times 10^{-5}$   | $1.3 \times 10^{15}$ |

It is presumed that the difference in the fill factor is caused by the quality of the I-type layer or the junction interfaces between the P-type and N-type layers. In confirmation of this, when comparing the film characteristics of the respective I-type layers deposited on a quartz glass substrate under the same conditions between the samples A and B, a slight difference in the optical gap, the dark conductivity, and the light conductivity has been observed, but little difference in the defect density has been observed.

Hence, it is presumed that the difference in the fill factor is caused not by the film characteristic of the I-type layer per se, but by the interfaces on which the junctions of the I-type layer are formed.

The photoelectric conversion layer of the solar battery is formed by sequentially laminating, for example the N-type layer, the I-type layer, and the P-type layer in the stated order. What is influenced by the temperature at which the I-type layer is formed is an underlying layer of the photoelectric conversion layer. Hence, in this example, the interface between the N-type layer and the I-type layer causes the difference in fill factor between the samples A and B.

It has been shown that the initial characteristics of the solar battery are excellent when the temperature at which the I-type layer is formed is low and the density of hydrogen is high, but the light deterioration is excellent when that temperature is high and the density of hydrogen is low.

However, in the above results, it is impossible to produce a solar battery having a low light deterioration ratio without lowering the initial conversion efficiency.

SUMMARY

The object of the present invention is to provide a thin film solar battery that maintains a high initial conversion efficiency and reduces the light deterioration. The object of the present invention is to provide a method of producing a thin film solar battery with improved light deterioration characteristics. The object of the present invention is to provide an apparatus for producing a thin film solar battery with improved light deterioration characteristics. The object of the present invention is to provide a method of producing a solar battery that reduces the defect level density of a junction interface between an under layer film and an I-type layer, and an apparatus for producing a semiconductor film that practices that method.

To solve the above problems, according to the present invention, there is provided an apparatus for producing a semiconductor film including a reaction chamber; gas exhaust means for exhausting gas in the reaction chamber to evacuate the interior of the reaction chamber; gas introduction means for introducing a reaction gas into the reaction chamber; glow discharge generation means disposed in the reaction chamber; and substrate heating means disposed in the reaction chamber, wherein the substrate is conveyed (transferred) in a desired direction within a glow discharge space defined by the glow discharge generation means, and the substrate heating means heats the substrate to different temperatures in the direction in which the substrate is conveyed.

The present invention has been achieved by an apparatus for producing a semiconductor film including: a reaction chamber; gas exhaust means for exhausting gas in the reaction chamber to evacuate the interior of the reaction chamber; gas introduction means for introducing a reaction gas into the reaction chamber; glow discharge generation means disposed in the reaction chamber; and substrate heating means disposed in the reaction chamber, wherein the substrate is conveyed (transferred) in a desired direction within a glow discharge space defined by the glow discharge generation means, a plurality of substrate heating means are disposed in the direction of conveyance of the substrate, and at least one of the plurality of substrate heating means is temperature controlled independently from the other substrate heating means.

The present invention has been achieved by an apparatus for producing a semiconductor film including: a reaction chamber; gas exhaust means for exhausting gas in the reaction chamber to evacuate the interior of the reaction chamber; gas introduction means for introducing a reaction gas into the reaction chamber; a glow discharge generation electrode disposed in the reaction chamber; a high-frequency power source that supplies a high-frequency power to the electrode to generate glow discharge; and substrate heating means disposed in the reaction chamber, wherein the substrate is conveyed in a desired direction within a glow discharge space defined by the glow discharge generation electrode and the high-frequency power source, the glow discharge generation means is comprised of a plurality of anode electrodes and a cathode opposed to the plurality of anode electrodes, the plurality of anode electrodes are disposed along the direction of conveyance of the substrate, the substrate is conveyed (transferred) in the desired direction between the anode electrodes and the cathode electrode, the anode electrodes are connected to ground potential, the cathode electrode is connected to the high-frequency power source, a plurality of substrate heating means are disposed in the direction of conveyance of the substrate, and at least one of the plurality of substrate heating means is temperature-controlled independently from the other substrate heating means.

In other words, the present invention provides an apparatus which is capable of heating the substrate at different temperatures in the direction of conveyance of the substrate during forming of an amorphous silicon film through glow discharge decomposition (plasma CVD).

In the above apparatus, the substrate heating means also serves as the anode electrodes. A flexible substrate may be used as the substrate. The flexible substrate may be conveyed by the roll-to-roll system.

According to the present invention, there is provided a thin film solar battery including a substrate, a photoreflective electrode, a photoelectric conversion layer, and a transparent electrode, wherein the photoelectric conversion layer is formed of a non-single crystalline semiconductor that mainly contains silicon and has at least one PIN junction, a substantially-intrinsic I-type layer forming the PIN junction is made of an alloy that mainly contains amorphous silicon hydride, and the substantially intrinsic I-type layer is formed of a plurality of amorphous silicon hydride alloy layers which are different in the density of hydrogen.

The I-type layer of the thin film solar battery can be produced by the above apparatus.

In the thin film solar battery, of the plurality of amorphous silicon hydride alloy layers forming the substantially-intrinsic I-type layer, the density of hydrogen in the layer formed at the transparent electrode side may be lower than the density of hydrogen in the layer formed at the photoreflective electrode side. Of the plurality of amorphous silicon hydride alloy layers forming the substantially intrinsic I-type layer, the density of hydrogen in the layer formed in a P-type layer side may be lower than the density of hydrogen in a layer formed in the N-type layer side. Of the plurality of amorphous silicon hydride alloy layers forming the substantially-intrinsic I-type layer, the density of hydrogen in the layer which is in contact with an impurity doped layer at the transparent electrode side may be lower than the density of hydrogen in the layer which is in contact with an impurity layer at the photoreflective electrode side.

Of the plurality of amorphous silicon hydride alloy layers forming the substantially-intrinsic I-type layer, the density of hydrogen in a layer formed in the P-type layer side is lower than the density of hydrogen in the layer formed at the N-type layer side, and the layer which is in contact with the P-type layer and a layer which is in the vicinity of that layer may have a density of hydrogen sufficient to lower the defect level density at the interface between the layer and the P-type layer.

The alloy that mainly contains amorphous silicon hydride may be an alloy of amorphous silicon carbon hydride. The alloy that mainly contains amorphous silicon hydride may also be of an alloy of amorphous silicon germanium hydride.

A flexible substrate may be used as the substrate.

According to the present invention, there is provided a method of producing a thin film solar battery, including the steps of: forming a substantially intrinsic I-type layer of a solar battery having a photoelectric conversion layer which is formed on a substrate having at least one PIN junction, where the PIN junction has a layer formed of an alloy layer that mainly contains amorphous silicon hydride, and which is formed through glow discharge decomposition. The I-type layer is formed while conveying the substrate along the desired direction. The improvement comprises making the substrate temperature different along the direction of conveyance of the substrate.

Using this method, the above thin film solar battery can be manufactured.

In the above method the substrate temperature when forming the I-type layer at the light incident side may be made higher than the substrate temperature when forming the I-type layer at the side opposite to the light incident side.

The substrate temperature used when forming the I-type layer which is in contact with an impurity doped layer at the light incident side may be made higher than the substrate temperature used when forming the I-type layer which is in contact with an impurity doped layer at the side opposite the light incident side.

In this case the substrate temperature when forming the I-type layer which is in contact with the impurity doped layer at the side opposite to the light incident side is preferably 80 to 200° C. The substrate temperature when forming the I-type layer which is in contact with the impurity doped layer at the light incident side is preferably 160 to 300° C.

The impurity doped layer at the light incident side may be P-type whereas the impurity layer at the side opposite to the light incident side may be N-type.

A flexible substrate may be used as the substrate and may be of the roll-to-roll type. The substrate temperature when forming the I-type layer which is in contact with the P-type layer is preferably 200 to 300° C.

According to the present invention, there is provided an apparatus for producing a semiconductor film, including: a reaction chamber; gas exhaust means for exhausting a gas in the reaction chamber to evaluate the interior of the reaction chamber; gas introduction means for introducing a reaction gas into the reaction chamber; and glow discharge generation means disposed in the reaction chamber, wherein a substrate is conveyed (transferred) in a desired direction within a glow discharge space defined by the glow discharge generation means, the glow discharge generation means generates a high-frequency electric power which varies in frequency, output, or both in the direction of conveyance of the substrate.

The present invention has been achieved by an apparatus for producing a semiconductor film, including: a reaction chamber; gas exhaust means for exhausting a gas in the reaction chamber to evaluate the interior of the reaction chamber; gas introduction means for introducing a reaction gas into the reaction chamber: a glow discharge generation electrode disposed in the reaction chamber; and a high frequency power source for supplying high-frequency electric power to the electrode to generate glow discharge, wherein a substrate is conveyed in a desired direction within a glow discharge space defined by the electrode and the high frequency power source, and the electrode and the high frequency power source generate a high-frequency electric power which varies in frequency, output or both in the direction of conveyance of the substrate.

The present invention has been achieved by an apparatus for producing a semiconductor film, including: a reaction chamber; gas exhaust means for exhausting a gas in the reaction chamber to evacuate the interior of the reaction chamber; gas introduction means for introducing a reaction gas into the reaction chamber; a glow discharge generation electrode disposed in the reaction chamber; and a high frequency power source for supplying a high-frequency electric power to the electrode to generate glow discharge, wherein the glow discharge generation electrode is comprised of an anode electrode and a plurality of cathodes opposed to the anode electrode, the plurality of cathode electrodes are disposed in the direction of conveyance of a substrate, the substrate is conveyed in the desired direction between the anode electrode and the cathode electrodes, the anode electrode is connected to ground potential, the cathode electrodes are each connected to the high-frequency power source, and the high frequency electric power supplied to at least one of the plurality of cathode electrodes is controlled in frequency, output, or both independently from the high-frequency electric power supplied to other cathode electrodes.

In other words, according to the present invention, there is provided an apparatus which is capable of supplying an output, a frequency, or both, which is different in the direction of conveyance of the substrate, during formation of an amorphous silicon film, by the glow discharge decomposition (plasma CVD) method.

In the above apparatus, one high-frequency power source may be connected to one cathode electrode. The plurality of cathode electrodes may be disposed along the direction of conveyance of the substrate. The reaction chamber is provided with substrate heating means, and the substrate heating means may heat the substrate to different temperatures along the direction of conveyance of the substrate.

In this situation, a plurality of the substrate heating means are disposed along the direction of conveyance of the substrate, and at least one of the substrate heating means may be temperature-controlled independently from the other substrate heating means. The substrate heating means may sere also as the anode electrode.

The above apparatus may be so arranged that one reaction chamber is disposed adjacent to another reaction chamber to form a film on top of a film formed in the other reaction chamber.

A flexible substrate may be used as the substrate. In this situation, the flexible substrate may be conveyed via the roll-to-roll system.

According to the present invention, there is provided a method of producing a thin film solar battery, including the steps of: forming a substantially-intrinsic I-type layer of a solar battery having a photoelectric conversion layer which is formed on a substrate, having at least one PIN junction, one layer of which is formed of an alloy layer that mainly contains amorphous silicon hydride. The alloy layer is formed by glow discharge decomposition. The I-type layer is formed while conveying a substrate in a desired direction. The improvement comprises varying the frequency, output or both of a high-frequency electric power source that generates the glow discharge in the direction of conveyance of the substrate.

In the above method, the frequency of electric power when forming the I-type layer at an underlying layer side may be made higher than that when forming other portions of the I-type layer. The electric power output when forming the I-type layer at the underlying-layer side may be made lower than when forming other portions of the I-type layer.

The substantially-intrinsic I-type layer of the photoelectric conversion layer of the thin film solar battery is formed by laminating a plurality of layers differing in the density of hydrogen, and the density of hydrogen in the layer positioned at the light incident side is lowered in order to reduce light deterioration.

Also, the density of hydrogen in the layer positioned at the side opposite to the light incident side is increased, thereby obtaining a thin film solar battery having a high initial conversion efficiency. Hence, with such a structure, the thin film solar battery has a high initial conversion efficiency and reduced light deterioration.

To change the density of hydrogen in the I-type layer which is a substantially-intrinsic semiconductor layer, the temperature of the substrate when forming the layer may be controlled. In other words, when forming the I-type layer which is at the light incident side or in contact with the impurity doped layer (P-type or N-type) at the light incident side, the substrate temperature is increased to decrease the density of hydrogen. The substrate temperature is preferably set to 160° C. or higher, more preferably 200 to 300° C.

When forming the I-type layer which is at the side opposite to the light incident side or in contact with the impurity doped layer (P-type or N-type), the substrate temperature is lowered and preferably set to 200° C. or lower, more preferably 80 to 180° C., to increase the density of hydrogen.

A plurality of layers forming the I-type layer are formed so that the density of hydrogen in each layer is increased from the light incident side toward the side opposite to the light incident side. The rate of change in the density of hydrogen may be gradual or continuous with an increased number of plural layers.

When the impurity doped layer at the light incident side is the P-type layer, the density of hydrogen in the I-type layer at the light incident side may be increased in a plurality of layers forming the I-type layer on the junction interface between the P-type layer and the I-type layer, the density of hydrogen may be decreased toward the side opposite the light incident side within about 500 Å from the junction interface, and the density of hydrogen may be again increased toward the side opposite the light incident side.

In such a structure, the defect level density in the I-type layer is decreased at the junction interface between the I-type layer and the P-type layer, so that the open-circuit voltage of the thin film solar battery is increased, and the conversion efficiency can be improved by up to about 10%.

In the apparatus for producing a semiconductor film while conveying the substrate in a desired direction at a desired speed within a glow discharge space as in the roll-to-roll system, a plurality of substrate heating means are disposed in one reaction chamber along the direction of conveyance of the substrate. The heating temperature of at least one substrate heating means is controlled independently from the other substrate heating means. With such an apparatus, films differing in the density of hydrogen can be continuously formed.

The respective thicknesses of the films differing in the density of hydrogen can be length-controlled so that the same temperature is established in the direction of conveyance of the substrate when the substrate conveying speed is held constant. That is, when a substrate heating means generates the same temperature, the respective thicknesses of the films differing in the density of hydrogen can be controlled in accordance with the length of the substrate heating means in the direction of conveyance of the substrate.

With such a structure, in the apparatus for producing the semiconductor film while conveying the substrate in a desired direction within the glow discharge space, a semiconductor layer having a given density of hydrogen and a given thickness can be continuously manufactured. As a result, a thin film solar battery with a high performance can be manufactured with high productivity.

In plasma CVD, by changing the high frequency output, which is supplied when forming an amorphous silicon film, the growth rate can be changed. As the high-frequency power output is increased, the growth rate has a tendency to increase.

As the growth rate is increased with the power output being increased, when the I-type layer is formed on the surface of a film at the underlying layer side, for example, on the N-type layer, the surface of the N-type layer is liable to be sputtered. As a result, the defect level density at the interface between the N-type layer and the I-type layer formed on the N-type layer is liable to increase.

The reduction of the defect level density at the interface between the P-type or N-type impurity layer, which is a film at the underlying layer side, and the I-type layer formed on the impurity doped layer, is an element that significantly contributes to an improvement in the fill factor (FF) of a solar battery to be manufactured. Hence, when forming a layer at the underlying layer side of the I-type layer, it is preferable that the high-frequency output is lowered to reduce sputtering of the film at the underlaying layer side.

The films at intermediate and upper portions of the I-type layer can be formed at higher speed by increasing the high frequency output, which contributes to an improvement in throughput.

By changing the high frequency during formation of a film, the self-bias voltage and growth rate are controlled. In plasma CVD, the self-bias voltage has a tendency to be lowered more as the applied high frequency is increased.

With lowered self-bias voltage, the sputtering on the surface of a film at the underlying layer side is reduced. As a result, the defect level density at the interface between the layer at the under layer side and the I-type layer, for example, at the N-I layer interface, is reduced, thereby improving the fill factor (FF), and also improving the photoelectric conversion efficiency.

As the high frequency is increased, the growth rate is gradually increased, and as the frequency is further increased, the growth rate has a tendency to gradually decrease. Using such a tendency, the high frequency is controlled to reduce the layer side sputtering of the surface of the film at the underlying and to lower the defect level density, thereby obtaining an excellent interface characteristic and forming a film at a high speed.

When the high-frequency output is lowered to reduce the sputtering of the surface of the film at the underlying layer side, the growth rate is decreased. However, if the high frequency is controlled to such a value that the self-bias voltage is low and the growth rate is high, a film formation at a high speed can be conducted while remarkably reducing the sputtering of the film at the underlying layer side.

In the case where a film is formed while conveying the substrate at a desired speed in a desired direction within a glow discharge space as in the roll-to-roll type apparatus, the thickness of the film is controlled by controlling the growth rate. With appropriate control of the output and of the high frequency, the thickness of films differing in characteristics can be readily controlled in a film forming process within the same reaction chamber.

The reaction chamber with such a structure is disposed adjacently downstream of a reaction chamber that forms another semiconductor film, e.g., an N-type layer, thereby enhancing the effect of reducing the defect level density at the interface between the semiconductor layer at the underlying layer side and the semiconductor layer formed thereon.

As a result, the fill factor of the solar battery and throughput can be improved.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

First Embodiment

Figure 1:
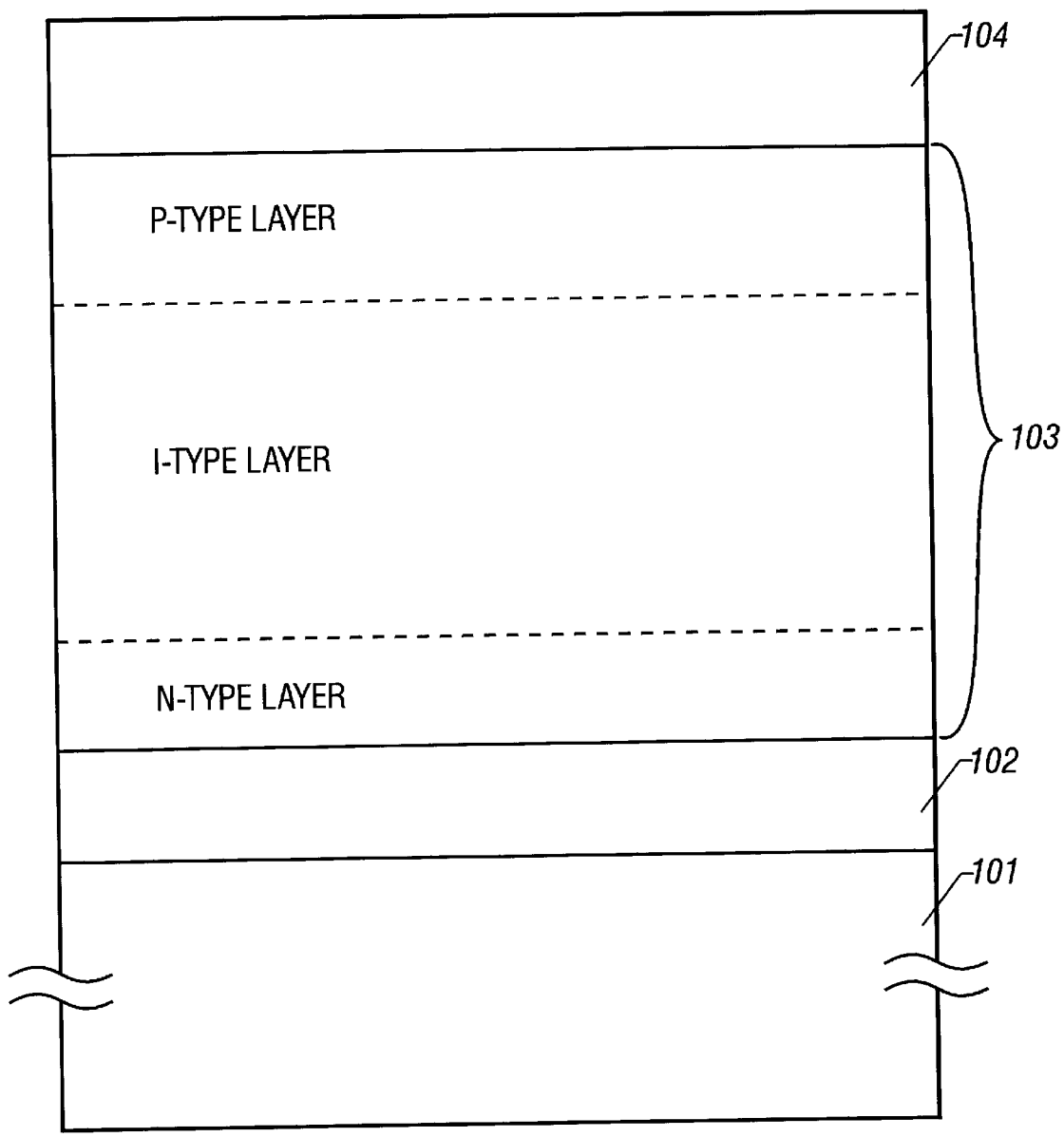
FIG. 1 shows an example of a cross-sectional structural view of a conventional thin film solar battery
Figure 2:
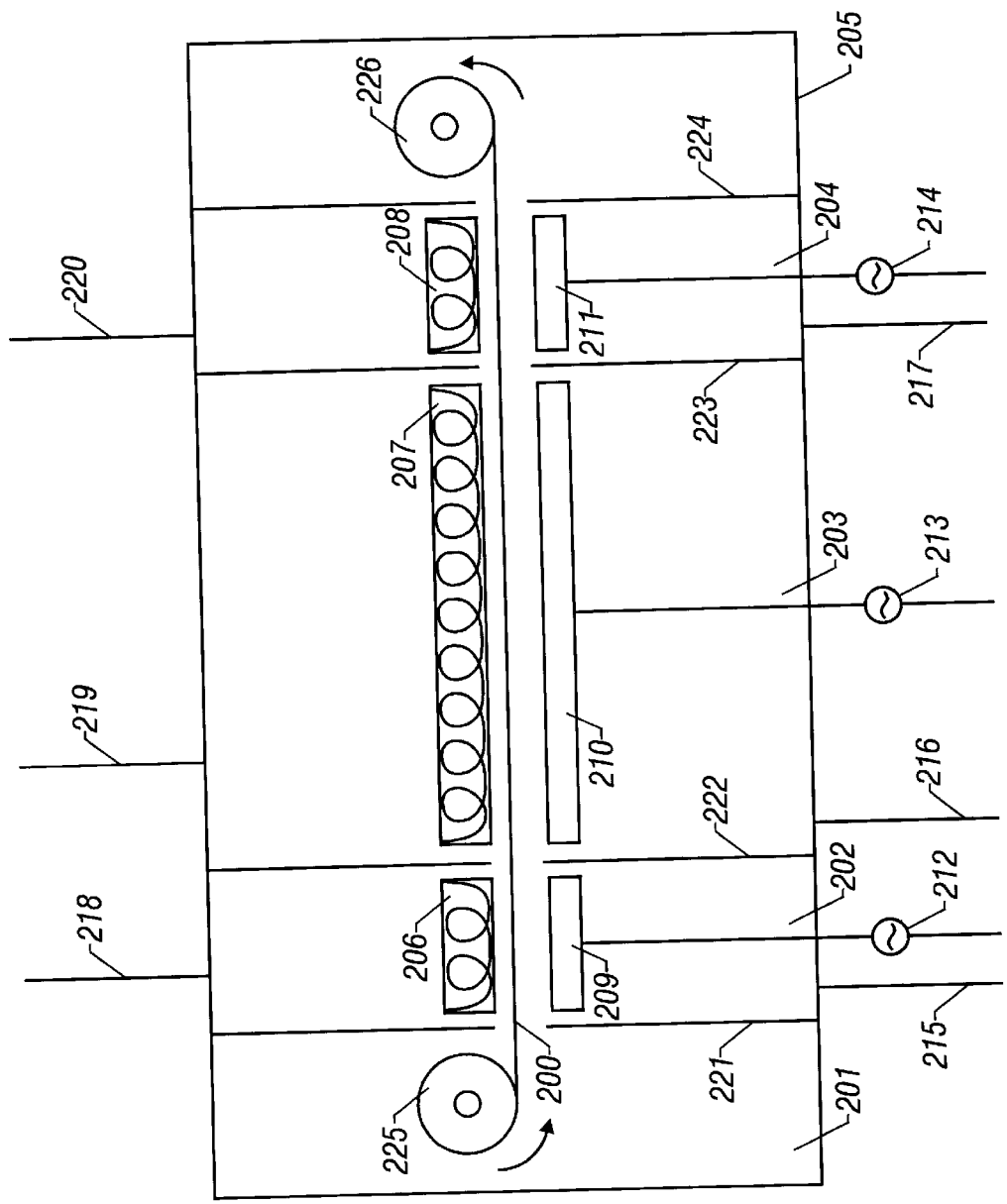
FIG. 2 shows an example of a conventional semiconductor film producing apparatus using the roll-to-roll system.
Figure 3:
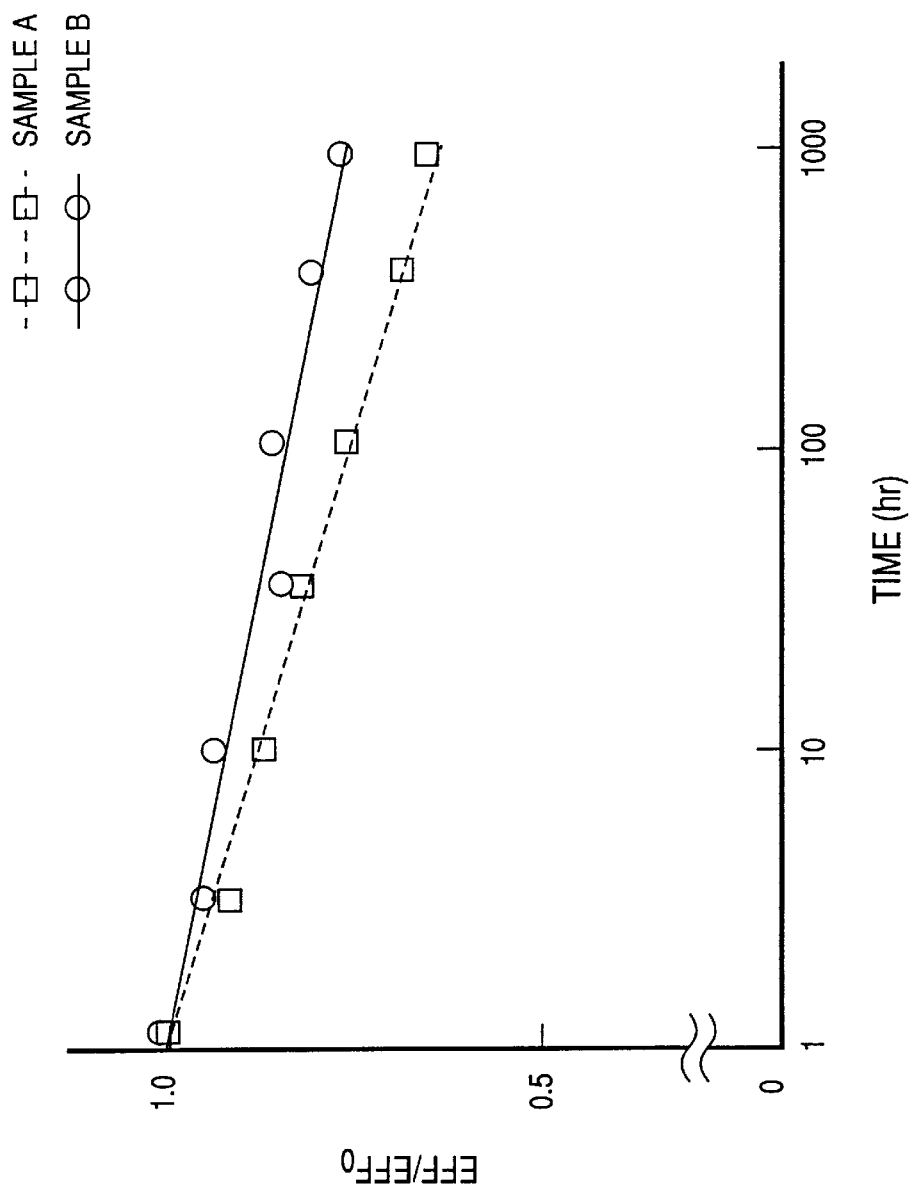
FIG. 3 shows the comparison result of the characteristics of solar batteries which differ in the density of hydrogen in the I-type layer.
Figure 4:
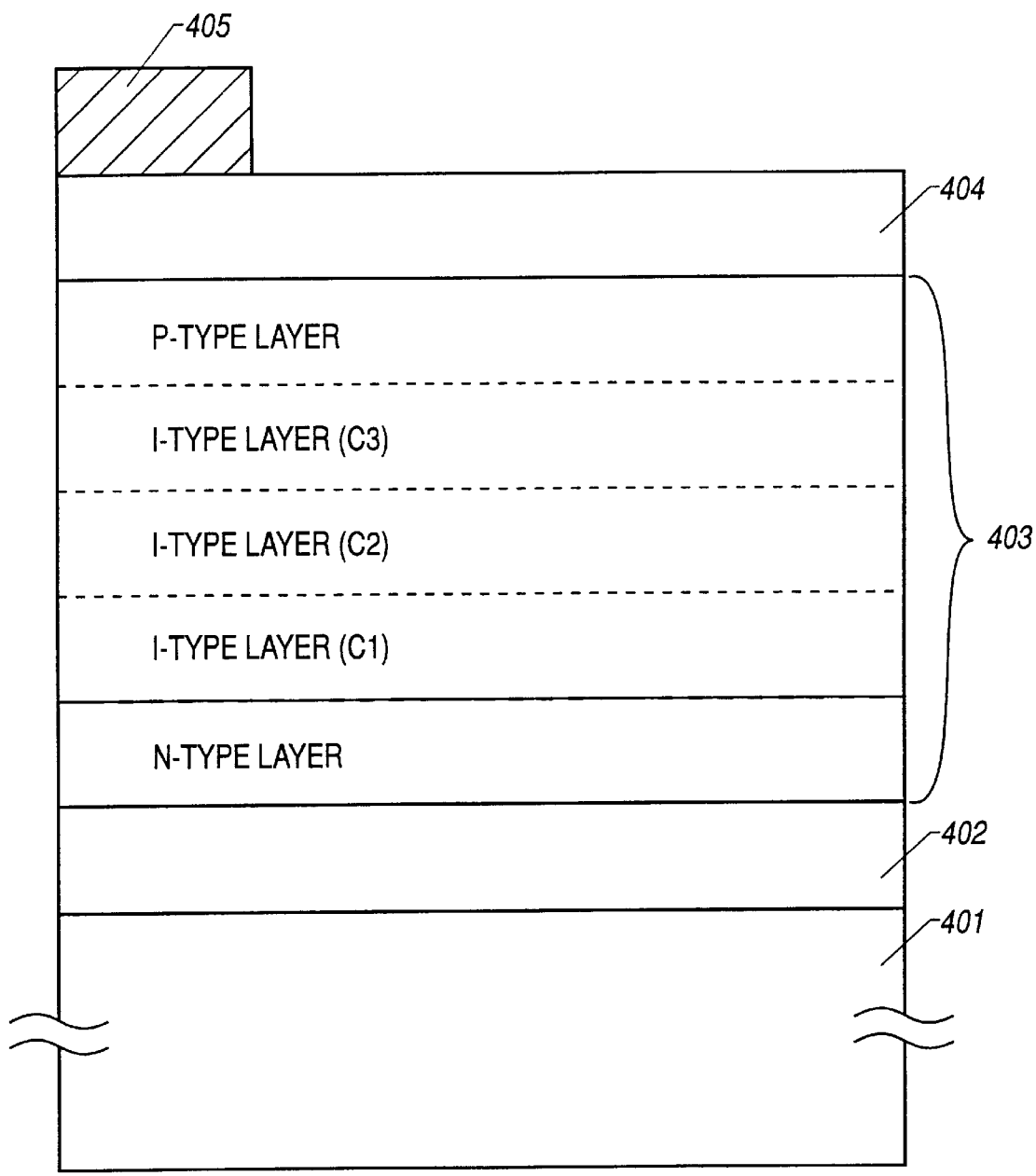
FIG. 4 shows a cross-sectional structure of a thin film solar battery produced in accordance with a first embodiment.

FIG. 4 shows a cross-sectional stricture of a thin film solar battery produced in a first embodiment. A photoreflective electrode 402, a photoelectric conversion layer 403, and a transparent electrode layer 404 are formed on one surface of a flexible substrate 401. The substrate 401 is formed of a PET (polyethylene terephthalate) film which is 75 μm thick and 250 mm wide. Other materials of the flexible substrate may be PEN (polyethylene naphthalate). PES (polyether sulfone), or the like.

The photoreflective electrode 402 is of a two-layer structure (not shown) of Al (aluminum) and a barrier metal. The barrier metal may be, for example, a metal such as Ti (titanium). Cr (chromium), Ni (nickel) stainless steel, or a metal oxide such as ZnO (zinc oxide). The photoreflective electrode 402 may also be a transparent electrode that mainly contains ITO (indium tin oxide) or tin oxide.

The photoelectric conversion layer 403 has an N-type μc (microcrystal)—Si:H layer, an I-type a (amorphous)—Si:H layer, and a P-type μc-Si:H layer laminated in the stated order on the photoreflective electrode 402. The I-type a-Si:H layer has a laminated structure having layers with hydrogen densities C1, C2, and C3 in the stated order from the N-type layer side.

The transparent electrode layer 404 is ITO (indium tin oxide). Since the sheet resistance of ITO is about 10 Ω to 100 kΩ/square, a grid electrode 405 (auxiliary electrode) of Ag (silver) is formed on the ITO to lower the sheet resistance in order to prevent output loss due to this resistance.

A process of manufacturing the thin film solar cell of FIG. 4 will be described. The photoreflective electrode 402 is formed on the flexible substrate 401. The substrate 401 is a PEN film (polyethylene naphthalate) of 75 μm thickness and 250 mm width.

The photoreflective electrode 402 is of the two-layer structure of Al (aluminum) and Ti (titanium), and the thicknesses of the respective layers are 150 nm and 3 nm.

The photoreflective electrode 402 is formed by sputtering. The sputtering unit is a unit adaptable to a roll-to-roll type apparatus wherein two targets for forming a film are provided, the flexible substrate 401 wound on a roll is unwound from one roll, and then conveyed in a reaction chamber while winding up the substrate 401 on a take-up roll, and a film is continuously formed thereon while winding up the flexible substrate on the take-up roll.

Subsequently, the photoelectric conversion layer 403 is formed. In the first embodiment, the layer 403 is formed by the roll-to-roll type plasma CVD apparatus of FIG. 5. This apparatus includes a supply chamber 501 for the unwinding of the roll-like flexible substrate 401, a take-up chamber 505 for winding up the film substrate, and reaction chambers 502, 503, and 504 disposed between the supply chamber 501 and the take-up chamber 505.

The reaction chambers 502 to 504 are disposed for forming each of the N-, I- and P-type layers, respectively. The respective chambers are partitioned by walls 506, 507, 508 and 509 each having a slit therein.

The respective reaction chambers are provided with substrate heating units 510, 511, 512, 513, and 514. The reaction chamber in which the I-type layer is formed is equipped with the plurality of substrate heating units 511, 512 and 513 which are temperature controllable independently from each other.

The respective reaction chambers have catheter glow discharge generation electrodes 515, 516, and 517 that apply high-frequency electric power, which are connected to respective high frequency power sources 520, 521, and 522.

The respective substrate heating units 510 to 514 each have a heater and serve as anodes. These substrate heating units 510 to 514 are electrically grounded and arranged as to be opposed to the electrodes 515, 516, and 517. The reaction chamber in which the I-type layer is formed contains one cathode electrode 516 and three substrate heating units 511, 512, and 513.

Gas exhaust units 523, 524, and 525 are disposed to exhaust a gas in the respective chambers. The gas exhaust units may be an auxiliary pump (not shown) such as a mechanical booster pump or a rotary pump. The respective reaction chambers are provided with gas introduction units 526. 527, and 528, respectively.

Figure 5:
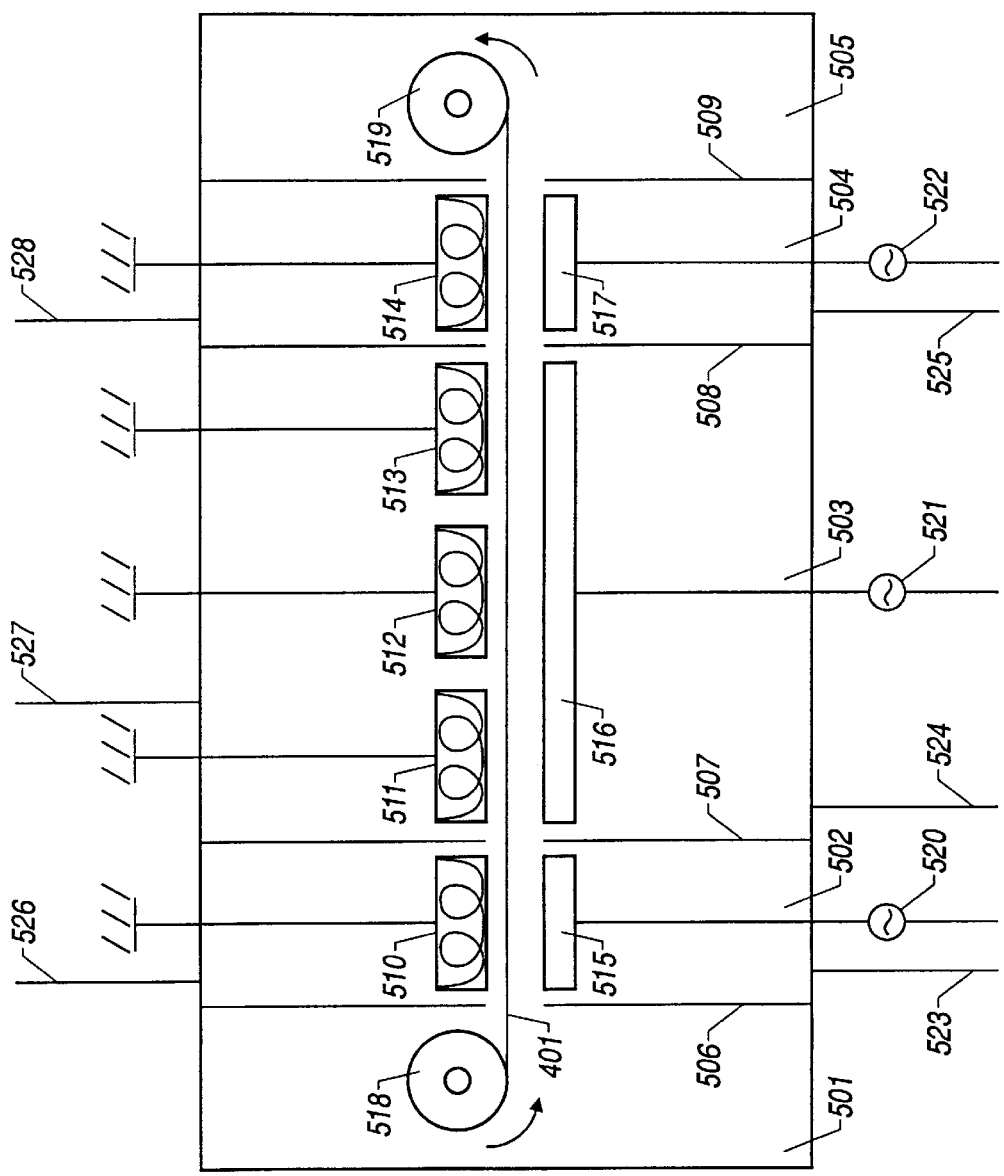
FIG. 5 shows a plasma CVD apparatus of the roll-to-roll type used in the first embodiment.

The anode electrode per se is not necessarily separated into electrodes 511, 512, and 513 as in FIG. 5 but may be formed as one electrode opposed to the cathode electrode 516. The substrate heating units may be so designed as to heat the substrate at different temperatures in the direction of conveyance of the substrate past the one anode electrode. A plurality of substrate heating units may be disposed within the anode in the direction of conveyance of the substrate past the electrode, to control the temperature of the respective substrate heating units independently from each other.

The substrate heating units may be disposed at a position such as at the back surface of the anode electrode. The substrate heating units may be formed of heating wire, ceramics, infrared ray lamps, etc.

The flexible substrate 401 wound on a bobbin 518 in the form of a roll, is drawn out from the bobbin 518 and is passed through the slits provided in the walls between the anodes and the cathodes of the respective reaction chambers before being wound up on a bobbin 519.

The respective film forming conditions of the N-, I-, and P-type layers in manufacturing the photoelectric conversion layer 403 is shown in Table 3.

TABLE 3

| N layer | |
|---|---|
| $PH_3$ (1%)/$SiH_4$ | 4 sccm |
| $H_2$ | 150 sccm |
| RF output | 200 W |
| Pressure | 0.5 Torr |
| Substrate temperature | 140° C. |
| I layer | |
| $SiH_4$ | 100 sccm |
| RF output | 40 W |
| Pressure | 1.0 Torr |
| P layer | |
| $B_2H_6$ (1%)/SiH4 | 4 sccm |
| $H_2$ | 150 sccm |
| RF output | 200 W |
| Substrate temperature | 100° C. |

In forming the I-type layer, the substrate temperature is controlled by the substrate heating units. In FIG. 5, the substrate temperature is 160° C. for the substrate heating unit 511, 200° C. for the substrate heating unit 512, and 240° C. for the substrate heating unit 513.

The density of hydrogen in the respective layers of the formed I-type layer is 25 atom % in layer C1, 18 atom % in layer C2, and 12 atom % in layer C3 in FIG. 4. The density of hydrogen is reduced from the N-type layer side (photoreflective electrode side) toward the P-type layer side (light incident side).

The thicknesses of the respective layers forming the photoelectric conversion layer 403 are 30 nm for the N-type layer and 20 nm for the P-type layer. The thickness of each of the respective layers C1, C2 and C3 of the I-type layer is 200 nm, and 600 nm in total.

By using the plasma CVD apparatus of FIG. 5, an I-type layer formed at different substrate temperatures (differing in the density of hydrogen) can be continuously formed.

The photoelectric conversion layer 403 may be of a single cell structure having one PIN junction or a two-layer tandem structure where two single cell structures are laminated in series. In the latter structure, the I-type layer of the top cell may be of a-Si:H or a-SiC:H. Similarly, layers differing in the density of hydrogen are laminated to form the I-type layer. The bottom cell may be formed with a-Si:H or a-SiGe:H. The photoelectric conversion layer 403 may also be of a three-layer tandem cell stack in which three PIN junctions are laminated, or a tandem stack of more than three cells.

Subsequently, the transparent electrode 404 is formed by a sputtering apparatus adapted to a roll-to-roll type method. The transparent electrode is made of ITO 70 nm in thickness. The grid electrode 405 that mainly contains silver (Ag) is formed as an auxiliary electrode because ITO is relatively high in sheet resistance.

A light irradiation examination was conducted using a solar simulator. The conditions of light irradiation were AM 1.5G, 100 mW/cm$^2$, cell temperature of 50° C., and irradiation time of 1000 hours.

The characteristics of a thin film solar battery of this embodiment using a plurality of a-Si:H layers differing in the density of hydrogen as the I-type layer are shown in Table 4. The deterioration ratio of the thin film solar battery relative to the initial value is 25%.

TABLE 4

| $E_{ff}$ (%) | FF | $J_{sc}$ (mA) | $V_{oc}$ (V) |
|---|---|---|---|
| 9.4 | 0.72 | 14.7 | 0.89 |

Second Embodiment

The second embodiment shows an example in which the density level of hydrogen in a plurality of amorphous silicon layers forming the I-type layer is changed differently from that in the solar battery of the first embodiment. In the second embodiment, the same production method and conditions as in the first embodiment are applied except for the substrate temperature when forming the I-type layer.

Similarly to the first embodiment, a photoreflective electrode is formed on a flexible substrate. An N-type layer is formed with a thickness of 30 nm on the photoreflective electrode to form a photoelectric conversion layer. The I-type layer is formed with a thickness of 200 nm at a substrate temperature of 240° C., 180 nm at 200° C., and 180 nm at 160° C. Also, the I-type layer is formed by four layers each having a thickness of 10 nm while the substrate temperature, when forming the respective layers, is raised to 180, 200, 220 and 240° C. for each 10 nm, and the thickness of the I-type layer is 600 nm in total. Then, a P-type layer at the light incident side is formed with a thickness of 20 nm. A transparent electrode and an auxiliary electrode are formed to complete a thin film solar battery.

Figure 6:
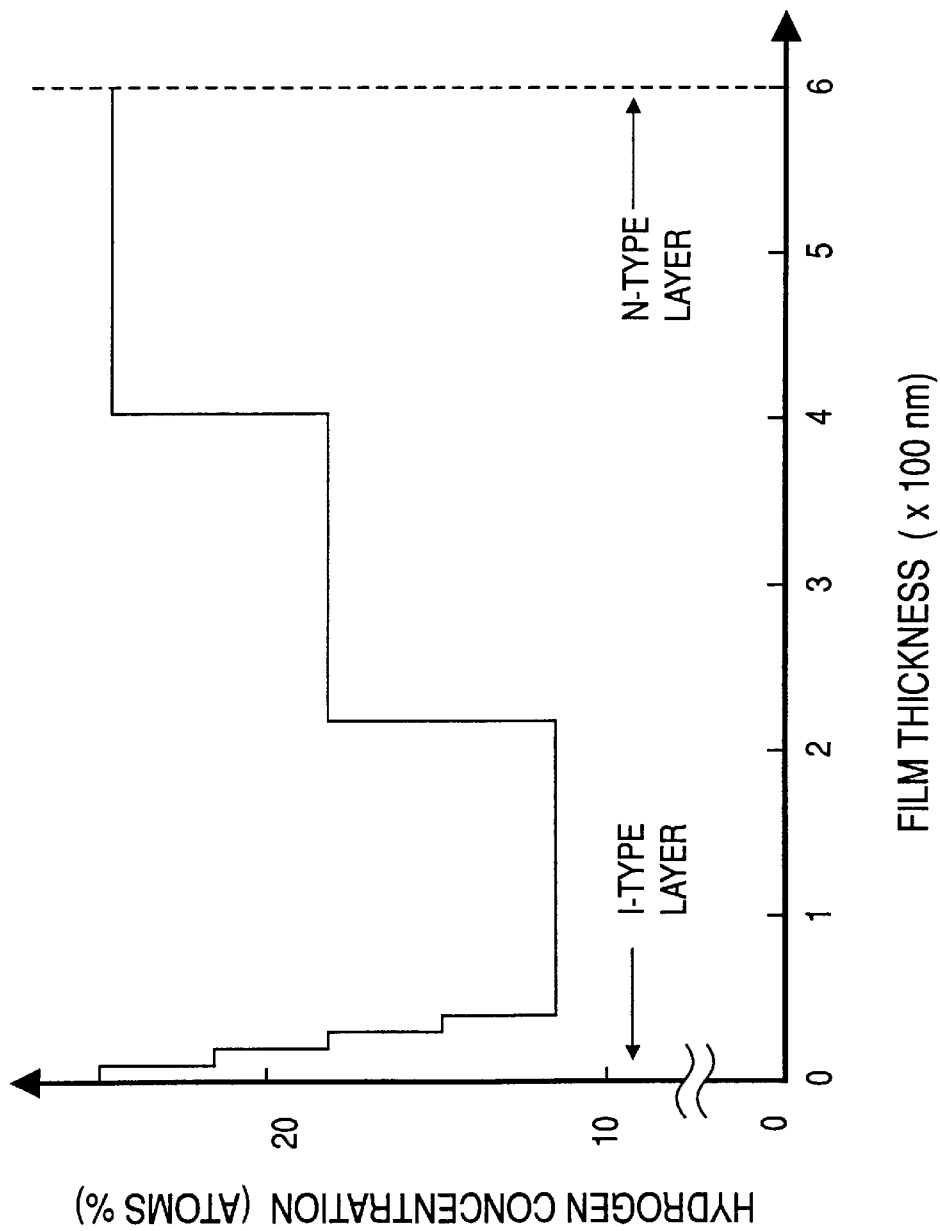
FIG. 6 is a graph showing the distribution of the density of hydrogen in a photoelectric conversion layer of the thin film solar battery manufactured in a second embodiment.

FIG. 6 shows the distribution of the density of hydrogen in the I-type photoelectric conversion layer of the thin film solar battery of the second embodiment. The density of hydrogen in the I-type layer at the light incident side is increased in a plurality of layers forming the I-type layer at the junction interface between the P-type layer and the I-type layer, the density of hydrogen is reduced toward the side opposite the light incident side, and the density of hydrogen is again increased toward the side opposite the light incident side. With such a structure, the defect level density within the I-type layer can be lowered at the junction interface between the I-type layer and the P-type layer.

In the thin film solar battery of the second embodiment, the open-circuit voltage ($V_{oc}$) is about 0.97 eV, Which is improved about 10% more than that of the thin film solar battery of the first embodiment, and the conversion efficiency is improved 10.2%.

Third Embodiment

A third embodiment shows an example of a plasma CVD apparatus which is capable of applying a high frequency output or frequency which differs in the direction of conveyance of the substrate.

Figure 7:
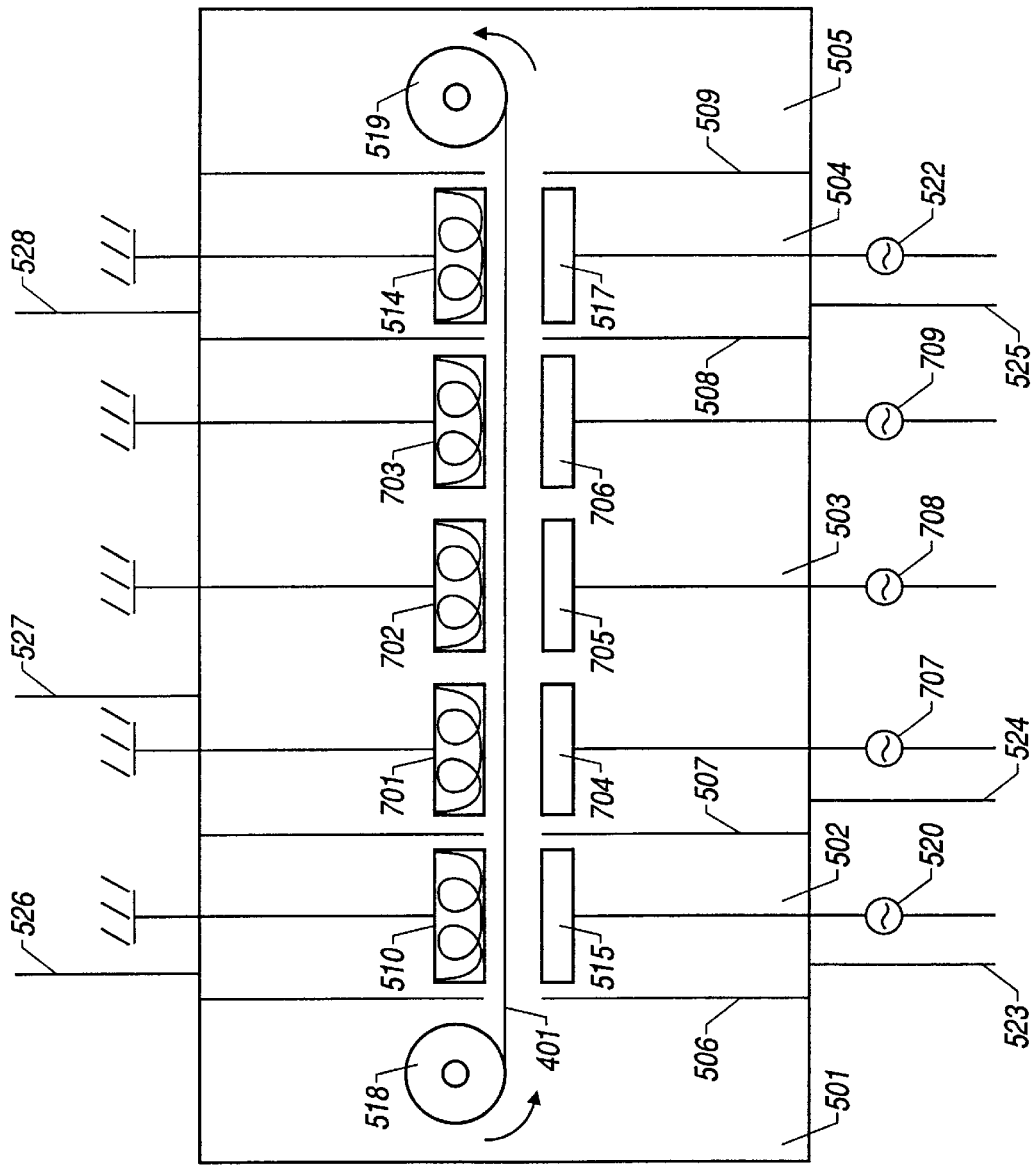
FIG. 7 shows a plasma CVD apparatus of the roll-to-roll type used in the embodiments.

FIG. 7 shows an example of the structure of the plasma CVD apparatus. This apparatus has the same structure as that in FIG. 5 except for reaction chamber 503 in which the I-type layer is formed. The reaction chamber 503 for forming the I-type layer in the apparatus of FIG. 7 is structured such that a plurality of glow discharge generation electrodes are disposed in the direction of conveyance of the substrate.

The glow discharge generation electrode includes anode electrodes 701 to 703 and cathode electrodes 704 to 706 opposed to the anode electrodes. The anode electrodes 701 to 703 are each connected to ground potential. High frequency power sources 707 to 709 are connected to the cathode electrodes 704 to 706, respectively. High frequency power is applied between each pair of opposed anode and cathode to generate a plasma.

The plasma CVD apparatus of this embodiment is of the roll-to-roll type, and a flexible substrate 401 passes between each pair of electrodes at a desired speed. Thus, the thickness of a layer formed between each pair of electrodes can be controlled in accordance with the length of the cathode electrode opposed to the anode electrode in the direction of conveyance of the substrate. The lengths of each of the cathode electrodes 704 to 706 in the direction of conveyance of the substrate are identical to each other.

The high-frequency power sources 707 to 709 independently apply a high frequency power having a frequency of 1 to 120 MHZ and an output of 10 to 80 mW/cm$^2$ to the cathode electrodes 704 to 706, respectively.

Although one high-frequency power source is connected to each cathode electrode in this example, high frequency power can be applied to a plurality of cathode electrodes by branching the output of one high-frequency power source. For example, one output of one high-frequency power source can be divided into a plurality of outputs, and an output adjusting unit is disposed on each output branch so that an output from each output adjusting unit is applied to each cathode electrode.

The anode electrodes 701 to 703 also serve as substrate heating units, and the respective substrate heating units are designed so as to independently control the temperature of the substrate as in the apparatus of FIG. 5.

The anode electrode per se is not necessarily divided into a plurality of anode electrodes in FIG. 7, but may be constituted as one electrode opposed to the cathode electrode. That is, in the interior of one anode electrode, the substrate heating units may be so constituted as to heat the substrate at different temperatures along the direction of conveyance of the substrate. For example, a plurality of substrate heating units may be disposed in the direction of conveyance of the substrate in the interior of the anode electrode so that the temperature of each substrate heating unit is independently controlled.

The substrate heating units may be located at a position other than the interior of the anode electrode, such as at the back surface of the anode electrode. The substrate heating units may be formed of a heating wire, ceramics, infrared ray lamps, etc.

The plasma CVD apparatus structured as in the reaction chamber 503 can apply a high frequency power having an output and frequency which varies in the direction of conveyance of the substrate. As a result, in forming a plurality of layers within the same reaction chamber in an apparatus in which a film is formed while a substrate is conveyed in a desired direction within a glow discharge space as in the roll-to-roll type apparatus, the formation rate of each film and self-bias voltage can be controlled. With control of the formation rate, the thickness of each layer can be controlled even though the length of the cathode electrode in the direction of conveyance of the substrate is not changed. Also, since the self-bias voltage can be controlled, the degree of sputtering on underlying surfaces can be controlled.

Using the plasma CVD apparatus of this embodiment, a solar battery with a higher performance can be produced. In particular, a high-speed film formation can be conducted while sputtering of a film at a base layer side is reduced. Thus, when a film is formed within a first reaction chamber and then another film is formed thereon within a second reaction chamber, which is adjacent to the first reaction chamber, and has the structure of the reaction chamber 503 in FIG. 7, a solar battery with significantly reduced defect level density at the junction interface of both the films, and a high conversion efficiency can be produced with high productivity. A specific example of this structure is shown in a fourth embodiment.

A fourth embodiment shows an example in which a solar battery is produced by the plasma CVD apparatus of FIG. 7. The solar battery of this embodiment has the structure of FIG. 4, and the I-type layer is comprised of three layers C1 to C3 which differ in film forming conditions.

The solar battery is produced through the same process as that in the first embodiment, by the plasma CVD apparatus of FIG. 7, and in the same conditions as those in the first embodiment, except for the conditions under which the I-type layer is formed.

The flexible substrate 401 on which a photoreflective electrode is formed, which is wound on the bobbin 518 in the form of a roll, passes between an anode electrode and a cathode electrode disposed, for glow discharge generation, within each reaction chamber, before being wound up on the bobbin 519.

An N-type layer is formed within the reaction chamber 502. Then, the I-type layer 403 is formed within the reaction chamber 503. The frequencies and outputs of the high-frequency power sources 707 to 709 within the reaction chamber 503 are independently controlled, respectively, to form the layers C1 to C3.

A P-type layer at the light incident side is formed in the reaction chamber 504, and the flexible substrate 401 is wound up on the bobbin 519. Then, the transparent electrode 404 made of ITO and the grid electrode 405 made of silver are formed on the P-type layer as in the first embodiment, to complete a solar battery.

The high frequency power when forming the I-type layer 403 has a frequency of 1 to 120 MHZ. As the frequency is high, the self-bias voltage is lowered more, thereby reducing sputtering on the film at the base layer side.

When the high frequency power output and the flow rate of a reaction gas are held constant, the film formation rate is the highest in the vicinity of 60 MHZ. With an increase in the flow rate of reaction gas or the high-frequency power output, the film formation rate at a frequency far from 60 MHZ, for example 120 MHZ, has a tendency to approach the film formation rate in the vicinity of 60 MHZ.

It is preferable that the high frequency power output is 10 to 30 mW/cm$^2$ on the electrode surface of the cathode electrode.

Although the film formation rate tends to be higher as the power output is increased, the film formation rate is held constant when the output reaches a certain degree or higher. This is because the film formation rate depends on the flow rate of the reaction gas and the high frequency output.

The high-frequency power source 707 used to form the layer C1 is set to 60 MHZ and 32 mW/cm$^2$, and the high-frequency power sources 708 and 709 used to form the layers C2 and C3 are set to 13.56 MHZ and 48 mW/cm$^2$.

For the formation conditions of the I-type layer C1 in contact with an impurity doped layer at a side opposite to the light incident side, the high frequency power output is set to a low value, and the frequency is set to a high value. Thus, sputtering of the N-type layer at a base layer side is reduced so that the defect level density at the N-I interface is reduced. The output power and frequency used for the layers C2 and C3 are set to general values.

Since the frequency when forming the layer C1 is set to 60 MHZ, the film formation rate is the highest for the same high frequency power output. The reason why the frequency of the high film formation rate is used is that the layers C1 to C3 having the same thickness are formed using the cathode electrodes 704 to 706 having the same length in the direction of conveyance of the substrate. That is, the film formation rate is set to be low because the high-frequency power output is lowered to reduce the sputtering of the N-type layer when forming the layer C1. Therefore, the frequency is set so that the film formation rate becomes high, and the thickness of the layer C1 is set so as to be equal to the thickness of the layers C2 and C3.

When the thickness of the layer C1 is thinner than those of the layers C2 and C3 using the same apparatus as in this embodiment, the frequency of the high frequency power may be set to high, that is, 100 to 120 MHZ. Thus, the sputtering of the film at the base layer side is further reduced, thereby further reducing the defect level density at the N-I interface.

The length of each cathode electrode in the direction of conveyance of the substrate may be changed in accordance with the thickness of the film to be formed.

The substrate temperature when forming the I-type layer is set to 100 to 300° C., for example, 200° C., and in the layers C1 to C3, the temperatures of the anode electrodes 701 to 703 that also serve as the substrate heating units are controlled so that the substrate temperature is held to 200° C.

The pressure within the reaction chamber 503 forming the I-type layer is 0.05 to 2.0 Torr, and in this particular embodiment, 1.0 Torr. The thickness of each of the formed I-type layers C1 to C3 is 200 nm, and 600 nm in total.

The characteristics of the solar battery were compared with the characteristics at a comparative solar battery. The comparative solar battery was produced under the same conditions as in the fourth embodiment except that all the layers C1 to C3 are formed under the conditions of 13.56 MHZ and 48 mW/cm$^2$. The solar battery of the fourth embodiment is 10% or more improved in fill factor and photoelectric conversion efficiency over the comparative solar battery.

In addition to the conditions of this embodiment, the solar battery may be produced by controlling the density of hydrogen while the substrate temperature is varied in the direction of conveyance of the substrate, as in the first embodiment or the second embodiment. With such an arrangement, the photoelectric conversion efficiency of the solar battery can be further improved, and the deterioration of the characteristics due to long-term use can be reduced.

The embodiments described in this specification show only the structure of the roll-to-roll apparatus using a flexible substrate. However, if it is a system in which a film is formed while the substrate is conveyed at a desired speed in a desired direction within a glow discharge space, the effects of the present invention described in this specification can be obtained. Even though a film is formed on a substrate which has a desired size and is rigid such as a glass substrate, and is conveyed by a belt conveyor, the same effect can be obtained.

According to the present invention, a thin film solar battery which is high in initial conversion efficiency and reduced in light deterioration can be obtained. Also, a method and an apparatus for readily manufacturing such a thin film solar battery can be provided.

A number of embodiments of the present invention have been described. Nevertheless, it will be understood that various modifications may be made without departing from the spirit and scope of the invention. Accordingly, other embodiments are within the scope of the following claims.

What is claimed is:

1. A solar battery comprising:

a substrate;

a photoreflective electrode formed on the substrate;

a photoelectric conversion layer formed on the photoreflective electrode; and a transparent electrode formed on the photoelectric conversion layer, wherein the photoelectric conversion layer comprises a non-single crystalline semiconductor comprising silicon, and has at least one PIN junction including a P-type impurity layer, an N-type impurity layer, and an I-type layer provided between the P-type impurity layer and the N-type impurity layer, wherein the I-type layer comprises at least three hydrogenated non-single crystalline semiconductor layers, one of the three hydrogenated non-single crystalline semiconductor layers being provided between the other two of the three hydrogenated non-single crystalline semiconductor layers, wherein hydrogen densities of the at least three hydrogenated non-single crystalline semiconductor layers are stepwise changed to be stepwise lowered from a side of the N-type impurity layer toward a side of the P-type impurity layer, and wherein the stepwise change is formed at a boundary between the one of the three hydrogenated non-single crystalline semiconductor layers and each of the other two of the three hydrogenated non-single crystalline semiconductor layers.

2. The solar battery of claim 1 wherein the three hydrogenated non-single crystalline semiconductor layers comprise amorphous silicon.

3. The solar battery of claim 1 wherein the I-type layer comprises an alloy of amorphous silicon carbon hydride.

4. The solar battery of claim 1 wherein the I-type layer comprises an alloy of amorphous silicon germanium hydride.

5. The solar battery of claim 1 wherein the substrate is flexible.

6. The solar battery of claim 1 further comprising a grid electrode provided on the transparent electrode.

7. A solar battery comprising:

a substrate;

a photoreflective electrode formed on the substrate;

a photoelectric conversion layer formed on the photoreflective electrode; and a transparent electrode formed on the photoelectric conversion layer, wherein the photoelectric conversion layer comprises a non-single crystalline semiconductor comprising silicon, and has at least one PIN junction including a P-type impurity layer, an N-type impurity layer, and an I-type layer provided between the P-type impurity layer and the N-type impurity layer, wherein the I-type layer comprises at least three hydrogenated amorphous semiconductor layers, one of the three hydrogenated amorphous semiconductor layers being provided between the other two of the three hydrogenated amorphous semiconductor layers, wherein hydrogen densities of the at least three hydrogenated amorphous semiconductor layers are stepwise changed to be stepwise lowered from a side of the N-type impurity layer toward a side of the P-type impurity layer, and wherein the stepwise change is formed at a boundary between the one of the three hydrogenated amorphous semiconductor layers and each of the other two of the three hydrogenated amorphous semiconductor layers.

8. The solar battery of claim 7 wherein the I-type layer comprises an alloy of amorphous silicon carbon hydride.

9. The solar battery of claim 7 wherein the I-type layer comprises an alloy of amorphous silicon germanium hydride.

10. The solar battery of claim 7 wherein the substrate is flexible.

11. The solar battery of claim 7 further comprising a grid electrode provided on the transparent electrode.

12. A solar battery comprising:
a substrate;
a photoreflective electrode formed on the substrate;
a photoelectric conversion layer formed on the photoreflective electrode; and
a transparent electrode formed on the photoelectric conversion layer,
wherein the photoelectric conversion layer comprises a non-single crystalline semiconductor comprising silicon, and has at least one PIN junction including a P-type impurity layer, an N-type impurity layer, and an I-type layer provided between the P-type impurity layer and the N-type impurity layer,
wherein the I-type layer comprises a plurality of hydrogenated amorphous semiconductor layers, one of the hydrogenated amorphous semiconductor layers being provided in contact with another of the hydrogenated amorphous semiconductor layers,
wherein hydrogen densities of the hydrogenated amorphous semiconductor layers are stepwise changed to be stepwise lowered from a side of the N-type impurity layer toward a side of the P-type impurity layer, and
wherein the stepwise change is formed at a boundary between the one of the hydrogenated amorphous semiconductor layers and the another of the hydrogenated amorphous semiconductor layers.

13. The solar battery of claim 12 wherein the I-type layer comprises an alloy of amorphous silicon carbon hydride.

14. The solar battery of claim 7 wherein the I-type layer comprises an alloy of amorphous silicon germanium hydride.

15. The solar battery of claim 12 wherein the substrate is flexible.

16. The solar battery of claim 12 further comprising a grid electrode provided on the transparent electrode.

17. A solar battery comprising:
a substrate;
a photoreflective electrode formed on the substrate;
a photoelectric conversion layer formed on the photoreflective electrode; and
a transparent electrode formed on the photoelectric conversion layer,
wherein the photoelectric conversion layer comprises a non-single crystalline semiconductor comprising silicon, and has at least one PIN junction including a P-type impurity layer, an N-type impurity layer, and an I-type layer provided between the P-type impurity layer and the N-type impurity layer, wherein the I-type layer comprises at least three hydrogenated non-single crystalline semiconductor layers, one of the three hydrogenated non-single crystalline semiconductor layers being provided between the other two of the three hydrogenated non-single crystalline semiconductor layers, wherein hydrogen densities of the at least three hydrogenated non-single crystalline semiconductor layers are stepwise changed to be stepwise lowered from a side of the N-type impurity layer toward a side of the P-type impurity layer, wherein the stepwise change is formed at a boundary between the one of the three hydrogenated non-single crystalline semiconductor layers and each of the other two of the three hydrogenated non-single crystalline semiconductor layers, and wherein the I-type layer comprises a material selected from the group consisting of an alloy of amorphous silicon carbon hydride and an alloy of amorphous silicon germanium hydride.

18. The solar battery of claim 17, wherein the substrate is flexible.

19. The solar battery of claim 17, further comprising a grid electrode provided on the transparent electrode.

20. A solar battery comprising:
a substrate;
a photoreflective electrode formed on the substrate;
a photoelectric conversion layer formed on the photoreflective electrode; and
a transparent electrode formed on the photoelectric conversion layer,
wherein the photoelectric conversion layer comprises a non-single crystalline semiconductor comprising silicon, and has at least one PIN junction including a P-type impurity layer, an N-type impurity layer, and an I-type layer provided between the P-type impurity layer and the N-type impurity layer, wherein the I-type layer comprises at least three hydrogenated amorphous semiconductor layers, one of the three hydrogenated amorphous semiconductor layers being provided between the other two of the three hydrogenated amorphous semiconductor layers, wherein hydrogen densities of the at least three hydrogenated amorphous semiconductor layers are stepwise changed to e stepwise lowered from a side of the N-type impurity layer toward a side of the P-type impurity layer, wherein the stepwise change is formed at a boundary between the one of the three hydrogenated amorphous semiconductor layers and each of the other two of the three hydrogenated amorphous semiconductor layers, and wherein the I-type layer comprises a material selected from the group consisting of an alloy of amorphous silicon carbon hydride and an alloy of amorphous silicon germanium hydride.

21. The solar battery of claim 20, wherein the substrate is flexible.

22. The solar battery of claim 20, further comprising a grid electrode provided on the transparent electrode.

23. A solar battery comprising:

a substrate;

a photoreflective electrode formed on the substrate;

a photoelectric conversion layer formed on the photoreflective electrode; and a transparent electrode formed on the photoelectric conversion layer, wherein the photoelectric conversion layer comprises a non-single crystalline semiconductor comprising silicon, and has at least one PIN junction including a P-type impurity layer, an N-type impurity layer, and an I-type layer provided between the P-type impurity layer and the N-type impurity layer, wherein the I-type layer comprises a plurality of hydrogenated amorphous semiconductor layers, one o the hydrogenated amorphous semiconductor layers being provided in contact with another of the hydrogenated amorphous semiconductor layers, wherein hydrogen densities of the hydrogenated amorphous semiconductor layers are stepwise changed to be stepwise lowered from a side of the N-type impurity layer toward a side of the P-type impurity layer, wherein the stepwise change is formed at a boundary between the one of the hydrogenated amorphous semiconductor layers and the another of the hydrogenated amorphous semiconductor layers, and wherein the I-type layer comprises a material selected from the group consisting of an alloy of amorphous silicon carbon hydride and an alloy of amorphous silicon germanium hydride.

24. The solar battery of claim 23, wherein the substrate is flexible.

25. The solar battery of claim 23, further comprising a grid electrode provided on the transparent electrode.

* * * * *